(12) United States Patent
Kwong et al.

(10) Patent No.: US 9,232,672 B2
(45) Date of Patent: Jan. 5, 2016

(54) CERAMIC INSERT CONTROL MECHANISM

(71) Applicant: Apple Inc., Cupertino, CA (US)

(72) Inventors: Kelvin Kwong, San Jose, CA (US); Benjamin J. Pope, Sunnyvale, CA (US); Nicholas G. Merz, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 266 days.

(21) Appl. No.: 13/738,107

(22) Filed: Jan. 10, 2013

(65) Prior Publication Data

US 2014/0192459 A1 Jul. 10, 2014

(51) Int. Cl.
*H01H 9/00* (2006.01)
*H05K 5/03* (2006.01)
(Continued)

(52) U.S. Cl.
CPC ................ *H05K 5/03* (2013.01); *G06F 1/1626* (2013.01); *G06F 3/02* (2013.01); *G06F 3/0202* (2013.01);
(Continued)

(58) Field of Classification Search
CPC ............. H01H 9/00; H01H 5/00; H01H 1/00; H01H 1/02; H01H 1/10; H01H 3/00; H01H 13/00; H01H 3/02; H01H 3/04; H01H 3/06; H01H 3/12; H01H 9/02; H01H 13/04; H01H 13/70; H01H 21/00; H01H 21/04; H01H 21/06; H01H 23/00; H01H 23/02; H01H 23/04; H01H 23/14; H01H 23/24; H01H 23/28; H01H 23/26; H01H 25/00; H01H 2003/00; H01H 2221/00; H01H 2221/012; H01H 2221/016; H01H 2223/00; H01H 2223/01; H01H 2223/012; H01H 2223/034; H01H 2223/0345; H01H 2223/056; H01H 2231/016; H01H 2231/026; H01H 2233/04; H01H 2231/052; H01H 2233/03; H01H 2233/05; H01H 2233/07; H01H 2239/05; H01H 2300/00

USPC ......... 200/314, 402, 468, 502, 511–514, 238, 200/329, 341, 293; 345/173
See application file for complete search history.

(56) References Cited

U.S. PATENT DOCUMENTS 2,248,955 A 7/1941 Capps
2,854,794 A 10/1958 Luedeman
(Continued)

FOREIGN PATENT DOCUMENTS

DE 202008002512 U1 6/2008
EP 0305626 3/1989
(Continued)

OTHER PUBLICATIONS

Schmid et al., "Effect of Crystal Orientation and Temperature on the Strength of Sapphire," J.Am.Ceram.Soc., 81, 1998, pp. 885-893.
(Continued)

*Primary Examiner* — Edwin A. Leon
*Assistant Examiner* — Anthony R. Jimenez
(74) *Attorney, Agent, or Firm* — Brownstein Hyatt Farber Schreck, LLP (57) ABSTRACT

A control mechanism for an electronic device comprises a cover glass having an aperture defined therein. The aperture extends from an interior to an exterior of the device. A control member is positioned within the aperture, coupled to an actuator. The control member comprises a ceramic insert having a contact surface exposed to the exterior of the housing, operable to actuate the actuator in response to a force on the contact surface. A bearing member is molded about the insert. The bearing member has a hardness less than that of the ceramic insert, and less than that of the cover glass.

20 Claims, 7 Drawing Sheets

(51) Int. Cl.
  *G06F 3/02* (2006.01)
  *H04M 1/23* (2006.01)
  *G06F 1/16* (2006.01)
  *H01H 13/04* (2006.01)
  *H01H 13/52* (2006.01)

(52) U.S. Cl.
  CPC .............. *H01H 13/04* (2013.01); *H01H 13/52* (2013.01); *H04M 1/23* (2013.01); *H01H 2013/525* (2013.01)

(56) References Cited

U.S. PATENT DOCUMENTS

| | | | |
|---|---|---|---|
| 3,753,775 A | 8/1973 | Robinson et al. | |
| 3,964,942 A | 6/1976 | Berkenblit et al. | |
| 4,008,111 A | 2/1977 | Rutz | |
| 4,054,895 A | 10/1977 | Ham | |
| 4,070,211 A | 1/1978 | Harari | |
| 4,085,302 A | 4/1978 | Zenk et al. | |
| 4,339,300 A | 7/1982 | Noble | |
| 4,393,578 A | 7/1983 | Cady et al. | |
| 4,662,124 A | 5/1987 | Kato et al. | |
| 4,732,867 A | 3/1988 | Schnable | |
| 4,735,917 A | 4/1988 | Flatley et al. | |
| 4,775,641 A | 10/1988 | Duffy et al. | |
| 4,811,004 A | 3/1989 | Person et al. | |
| 4,826,300 A | 5/1989 | Efron et al. | |
| 4,849,299 A | 7/1989 | Loth | |
| 4,908,074 A | 3/1990 | Hosoi et al. | |
| 4,946,546 A | 8/1990 | Bourgeois | |
| 5,151,389 A | 9/1992 | Zappella | |
| 5,154,023 A | 10/1992 | Sioshansi | |
| 5,377,669 A | 1/1995 | Schulz | |
| 5,413,360 A | 5/1995 | Atari et al. | |
| 5,427,051 A | 6/1995 | Maxwell et al. | |
| 5,441,591 A | 8/1995 | Imthurn et al. | |
| 5,451,553 A | 9/1995 | Scott et al. | |
| 5,543,630 A | 8/1996 | Bliss et al. | |
| 5,549,746 A | 8/1996 | Scott et al. | |
| 5,627,109 A | 5/1997 | Sassa et al. | |
| 5,661,313 A | 8/1997 | Dubbelday et al. | |
| 5,697,998 A | 12/1997 | Platus et al. | |
| 5,702,654 A | 12/1997 | Chen et al. | |
| 5,804,522 A | 9/1998 | Uegami | |
| 5,852,622 A | 12/1998 | Meissner et al. | |
| 5,877,094 A | 3/1999 | Egley et al. | |
| 6,025,060 A | 2/2000 | Meissner et al. | |
| 6,028,762 A | 2/2000 | Kamitani | |
| 6,030,849 A | 2/2000 | Hasegawa et al. | |
| 6,038,079 A | 3/2000 | Michaels | |
| 6,123,026 A | 9/2000 | Gottlieb | |
| 6,265,089 B1 | 7/2001 | Fatemi et al. | |
| 6,379,985 B1 | 4/2002 | Cervantes et al. | |
| 6,406,769 B1 | 6/2002 | Delabre | |
| 6,424,017 B2 | 7/2002 | Kurtz et al. | |
| 6,483,237 B2 | 11/2002 | Eastlund et al. | |
| 6,489,221 B2 | 12/2002 | Gehrke et al. | |
| 6,586,819 B2 | 7/2003 | Matsuoka | |
| 6,642,989 B2 | 11/2003 | Umehara et al. | |
| 6,775,073 B2 | 8/2004 | Kamo | |
| 6,818,532 B2 | 11/2004 | Yeom et al. | |
| 6,819,693 B2 | 11/2004 | Kinoshita et al. | |
| 6,849,524 B2 | 2/2005 | Shelton et al. | |
| 6,852,253 B2 | 2/2005 | Tomioka | |
| 6,858,274 B2 | 2/2005 | Fukazawa | |
| 6,872,108 B2 | 3/2005 | Fuse et al. | |
| 6,875,099 B2 | 4/2005 | Stepanovich | |
| 6,911,375 B2 | 6/2005 | Guarini et al. | |
| 7,018,709 B2 | 3/2006 | Stevenson et al. | |
| 7,030,417 B2 | 4/2006 | Ishibashi et al. | |
| 7,074,652 B2 | 7/2006 | Yoon et al. | |
| 7,128,846 B2 | 10/2006 | Nishijima et al. | |
| 7,151,045 B2 | 12/2006 | Kim et al. | |
| 7,171,290 B2 | 1/2007 | Lagadec et al. | |
| 7,208,096 B2 | 4/2007 | Akkipeddi et al. | |
| 7,255,740 B2 | 8/2007 | Sprenger et al. | |
| 7,390,702 B2 | 6/2008 | Nakamura | |
| 7,495,615 B2 | 2/2009 | Yamanaka et al. | |
| 7,616,951 B2 | 11/2009 | Chang et al. | |
| 7,619,567 B2 | 11/2009 | Lynch et al. | |
| 7,663,189 B2 | 2/2010 | Fukuda | |
| 7,683,838 B2 | 3/2010 | Koyama et al. | |
| 7,704,321 B2 | 4/2010 | Riman et al. | |
| 7,803,451 B2 | 9/2010 | Lee et al. | |
| 7,807,549 B2 | 10/2010 | Tong et al. | |
| 7,883,557 B2 | 2/2011 | Liu et al. | |
| 7,902,474 B2 * | 3/2011 | Mittleman et al. | 200/516 |
| 7,943,953 B2 | 5/2011 | Sakamoto et al. | |
| 7,956,356 B2 | 6/2011 | Tanikella et al. | |
| 7,966,785 B2 | 6/2011 | Zadesky et al. | |
| 7,977,587 B2 * | 7/2011 | Rajagopal et al. | 200/1 B |
| 8,003,189 B2 | 8/2011 | Jones et al. | |
| 8,157,912 B2 | 4/2012 | Wei | |
| 8,158,900 B2 * | 4/2012 | Maatta | 200/314 |
| 8,197,303 B2 | 6/2012 | Tanikella et al. | |
| 8,268,656 B2 | 9/2012 | Kajiyama | |
| 8,390,023 B2 | 3/2013 | Armitage et al. | |
| 8,455,879 B2 | 6/2013 | Tanikella et al. | |
| 8,624,759 B2 * | 1/2014 | Maenpaa et al. | 341/33 |
| 8,721,917 B2 | 5/2014 | Cherian et al. | |
| 2002/0017653 A1 | 2/2002 | Chuang | |
| 2002/0167068 A1 | 11/2002 | Hsu et al. | |
| 2002/0168837 A1 | 11/2002 | Hsu et al. | |
| 2006/0003587 A1 | 1/2006 | Hsu et al. | |
| 2006/0043396 A1 | 3/2006 | Tsuda et al. | |
| 2006/0162849 A1 | 7/2006 | Han | |
| 2006/0196849 A1 | 9/2006 | Moeggenborg et al. | |
| 2007/0204493 A1 | 9/2007 | Foley et al. | |
| 2008/0075941 A1 | 3/2008 | Tatartchenko et al. | |
| 2008/0145632 A1 | 6/2008 | Nagami | |
| 2008/0264767 A1 | 10/2008 | Chen et al. | |
| 2009/0098807 A1 | 4/2009 | Bakshi et al. | |
| 2009/0104409 A1 | 4/2009 | Derriey et al. | |
| 2009/0130415 A1 | 5/2009 | Mack, III et al. | |
| 2009/0321234 A1 | 12/2009 | Yu et al. | |
| 2010/0092728 A1 | 4/2010 | Hasegawa et al. | |
| 2011/0019123 A1 | 1/2011 | Prest et al. | |
| 2011/0019354 A1 | 1/2011 | Prest et al. | |
| 2011/0062394 A1 | 3/2011 | Kumaran et al. | |
| 2011/0177300 A1 | 7/2011 | Hankey et al. | |
| 2011/0195560 A1 | 8/2011 | Gaudin et al. | |
| 2011/0223840 A1 | 9/2011 | Morinaga et al. | |
| 2012/0038471 A1 | 2/2012 | Kim et al. | |
| 2012/0088099 A1 | 4/2012 | Tosatti et al. | |
| 2012/0118228 A1 | 5/2012 | Lee et al. | |
| 2012/0135177 A1 | 5/2012 | Cornejo et al. | |
| 2012/0212890 A1 | 8/2012 | Hoshino et al. | |
| 2012/0229424 A1 | 9/2012 | Behles et al. | |
| 2013/0237402 A1 | 9/2013 | Wang et al. | |
| 2014/0116329 A1† | 5/2014 | Chaudhari | |

FOREIGN PATENT DOCUMENTS

| | | |
|---|---|---|
| EP | 1013802 | 6/2000 |
| EP | 1829846 | 9/2007 |
| GB | 1135886 | 12/1968 |
| JP | 54032062 | 3/1979 |
| JP | 1173764 | 7/1989 |
| JP | 2039578 | 2/1990 |
| JP | 3021048 | 1/1991 |
| JP | 03115200 | 5/1991 |
| JP | 3177335 | 8/1991 |
| JP | 3250659 | 11/1991 |
| JP | 5027257 | 2/1993 |
| JP | 5085894 | 4/1993 |
| JP | 5313103 | 11/1993 |
| JP | 5333164 | 12/1993 |
| JP | 5335435 | 12/1993 |
| JP | 06242260 | 9/1994 |
| JP | 6314694 | 11/1994 |
| JP | 06337292 | 12/1994 |
| JP | 7129952 | 5/1995 |
| JP | 07145000 | 6/1995 |
| JP | 8040797 | 2/1996 |

(56) References Cited

FOREIGN PATENT DOCUMENTS

| | | |
|---|---|---|
| JP | 8148594 | 6/1996 |
| JP | 09008690 | 1/1997 |
| JP | 9213773 | 8/1997 |
| JP | 9270565 | 10/1997 |
| JP | 9295895 | 11/1997 |
| JP | 10239520 | 9/1998 |
| JP | 10269543 | 10/1998 |
| JP | 10275955 | 10/1998 |
| JP | 10335259 | 12/1998 |
| JP | 11135889 | 5/1999 |
| JP | 2000183203 | 6/2000 |
| JP | 2000196149 | 7/2000 |
| JP | 2001134927 | 5/2001 |
| JP | 2001176993 | 6/2001 |
| JP | 2001237335 | 8/2001 |
| JP | 2001298170 | 10/2001 |
| JP | 2002015977 | 1/2002 |
| JP | 2002109854 | 4/2002 |
| JP | 2002184845 | 6/2002 |
| JP | 2002201096 | 7/2002 |
| JP | 2002255694 | 9/2002 |
| JP | 2002289529 | 10/2002 |
| JP | 2002293692 | 10/2002 |
| JP | 2003015156 | 1/2003 |
| JP | 2003069176 | 3/2003 |
| JP | 2003133802 | 5/2003 |
| JP | 2003137690 | 5/2003 |
| JP | 2003245847 | 9/2003 |
| JP | 2003277194 | 10/2003 |
| JP | 2003282551 | 10/2003 |
| JP | 2003332234 | 11/2003 |
| JP | 2004111848 | 4/2004 |
| JP | 2004168622 | 6/2004 |
| JP | 2004288934 | 10/2004 |
| JP | 2004296575 | 10/2004 |
| JP | 2004296701 | 10/2004 |
| JP | 2004296912 | 10/2004 |
| JP | 2005047718 | 2/2005 |
| JP | 2005064492 | 3/2005 |
| JP | 2005079171 | 3/2005 |
| JP | 2005085888 | 3/2005 |
| JP | 2005101230 | 4/2005 |
| JP | 2005104742 | 4/2005 |
| JP | 2005136106 | 5/2005 |
| JP | 2005277334 | 10/2005 |
| JP | 2005285869 | 10/2005 |
| JP | 2005314121 | 11/2005 |
| JP | 2006016230 | 1/2006 |
| JP | 2006016239 | 1/2006 |
| JP | 2006062931 | 3/2006 |
| JP | 2006066442 | 3/2006 |
| JP | 2006232639 | 9/2006 |
| JP | 2006232640 | 9/2006 |
| JP | 2006339308 | 12/2006 |
| JP | 2007150072 | 6/2007 |
| JP | 2007237627 | 9/2007 |
| JP | 2007237628 | 9/2007 |
| JP | 2007269577 | 10/2007 |
| JP | 2008111984 | 5/2008 |
| JP | 2008211040 | 9/2008 |
| JP | 2008297150 | 12/2008 |
| JP | 2009263534 | 11/2009 |
| JP | 2010056485 | 3/2010 |
| KR | 20100090897 | 8/2010 |
| WO | WO98/56575 | 12/1998 |
| WO | WO02/054718 | 7/2002 |
| WO | WO2004/059731 | 7/2004 |
| WO | WO2007/143480 | 12/2007 |
| WO | WO2008/036888 | 3/2008 |
| WO | WO2008/122296 | 10/2008 |
| WO | WO2009/025842 | 2/2009 |
| WO | WO2009/151160 | 12/2009 |
| WO | WO2010/057842 | 2/2010 |

OTHER PUBLICATIONS

Quick, Darren, "Aston Martin teams with Mobiado for transparent touchscreen concept phone," Mar. 28, 2011, pp. 1-5, retrieved from the internet: URL:http://www-gizmag.com/cpt002-aston-martin-concept-phone/18248.

Zahler, James, "Sapphire and GaN Substrate Materials," DOE SSL Manufacturing R&D Workshop 2012, Presentation, Apr. 2012, pp. 1-19.

Flores, Marc, "Can a Case Scratch the iPhone 4's Glass and Shatter it?," Oct. 8, 2010, pp. 1-10, retrieved from the internet: URL:http://www.intomobile.com/2010/10/08/glassgate-iphone-4.

Sykes, Neil, "The Use of Lasers in Target Manufacture," 2010, pp. 1-24, retrieved from the internet: URL:heep://www.stfc.ac.uk/CLF/resources/PDF/events_3effw_weds_sykes.pdf.

International Search Report and Written Opinion, PCT Application No. PCT/US2013/0049444, 24 pages, Feb. 28, 2014.

International Search Report and Written Opinion, PCT Application No. PCT/US2014/0010145, 11 pages, Apr. 4, 2014.

Chaudhari, P. et al., Heteroepitaxial Silicon Film Growth at 600C from an Al—Si Eutectic Melt, pp. 5368-5371,Jul. 30, 2010, Thin Solid Films, USA.†

\* cited by examiner
† cited by third party

CERAMIC INSERT CONTROL MECHANISM

TECHNICAL FIELD

This subject matter of this disclosure relates generally to control components for electronic devices. In particular, the disclosure relates to buttons, switches, and other control mechanisms suitable for use in electronic devices, including, but not limited to, cellular phones, tablet computers, personal computers, personal digital assistants, media players, and other stationary and portable electronic devices.

BACKGROUND

Depending on application, electronic devices may utilize a wide variety of different control mechanisms, including buttons, pushbuttons, slide and toggle switches, and other devices for power, volume, home, hold, reset and other control and input functions. In use, these components are subject to a wide range of different environmental effects, including temperature extremes, humidity, contamination, physical and electrical contact, scratching, and impact, for which durability and reliability are critical engineering factors.

Environmental factors are particularly relevant in devices subject to both operational extremes and high performance demands, including portable electronics and mobile devices, where the control components must withstand heat, cold, moisture, humidity, shock and impact. Associated design and engineering considerations include tradeoffs between stress and strain resistance, machinability, temperature stability, and optical properties, including surface hardness, transparency, and resistance to scratching, abrasion, and temperature extremes. As a result, there is an ongoing need for improved control mechanisms that do not suffer the limitations of the prior art, including control mechanism for consumer electronics, digital devices, and mobile phone, smartphone, and tablet computer applications.

SUMMARY

This disclosure relates to control mechanism for electronic devices. In various examples and embodiments, the control mechanism may include a cover glass having an aperture extending from the interior to the exterior of the device. An actuator may be positioned proximate the aperture, and a control member may be positioned within the aperture, coupled to the actuator.

The control member may include a ceramic insert having a contact surface exposed to the exterior of the cover glass, operable to actuate the actuator in response to a force on the contact surface. A bearing member may be molded about the ceramic insert, and positioned within the aperture between the insert and the cover glass. The bearing member may have a hardness less than that of the ceramic insert, and less than that of the cover glass.

A bias member may be configured to retain the control member within the aperture, during operation of the control mechanism. The ceramic insert may be formed of a substantially single crystal aluminum oxide material, the cover glass may be formed of a transparent ceramic, and the transparent ceramic may comprise sapphire or corundum. The bearing member may be formed of a plastic material.

A light source may be disposed proximate the aperture, and configured to illuminate the ceramic insert. The ceramic insert may have an index of refraction matching that of the cover glass, and the bearing member may have an index of refraction matching that of either of both the ceramic insert and the cover glass. The ceramic insert and bearing member can also be configured to present a substantially optically matching contact surface for actuation of the control mechanism.

In additional examples and embodiments, an apparatus may include a ceramic cover glass having an aperture extending from an interior to an exterior of the device. An actuator may be positioned within the electronic device, proximate the aperture and coupled to a control member disposed therein.

The control member may include a substantially single crystal ceramic insert exposed to the exterior of the housing, operable to actuate the actuator. A bearing member may be disposed about the ceramic insert, positioned within the aperture between the insert and the cover glass. The bearing member may have a hardness substantially less than that of the ceramic insert, and substantially less than that of the cover glass.

The ceramic cover glass may comprise or be formed of a substantially single crystal sapphire material, and the ceramic insert may be formed of a substantially single crystal aluminum oxide material, which may comprise sapphire or corundum.

The bearing member may be formed a plastic material, which is insert molded about the ceramic insert. Alternatively, the bearing member may be formed of a metal or metal alloy, such as aluminum or steel, or from a precious metal or metal alloy such as silver, gold, or platinum. The control member can be configured as a pushbutton, a rocker type switch, or a sliding switch, as operable to actuate the actuator in response to a force on the ceramic insert.

A digital electronic device may be assembled from the control mechanism or apparatus, in combination with a display. For example, the control member may be configured as a pushbutton, provided or disposed within the ceramic cover glass. In the digital electronic device, the ceramic insert may have an index of refraction substantially matching that of the cover glass, and the bearing member may have an index of refraction substantially matching that of the cover glass and the ceramic insert.

DETAILED DESCRIPTION

Figure 1:
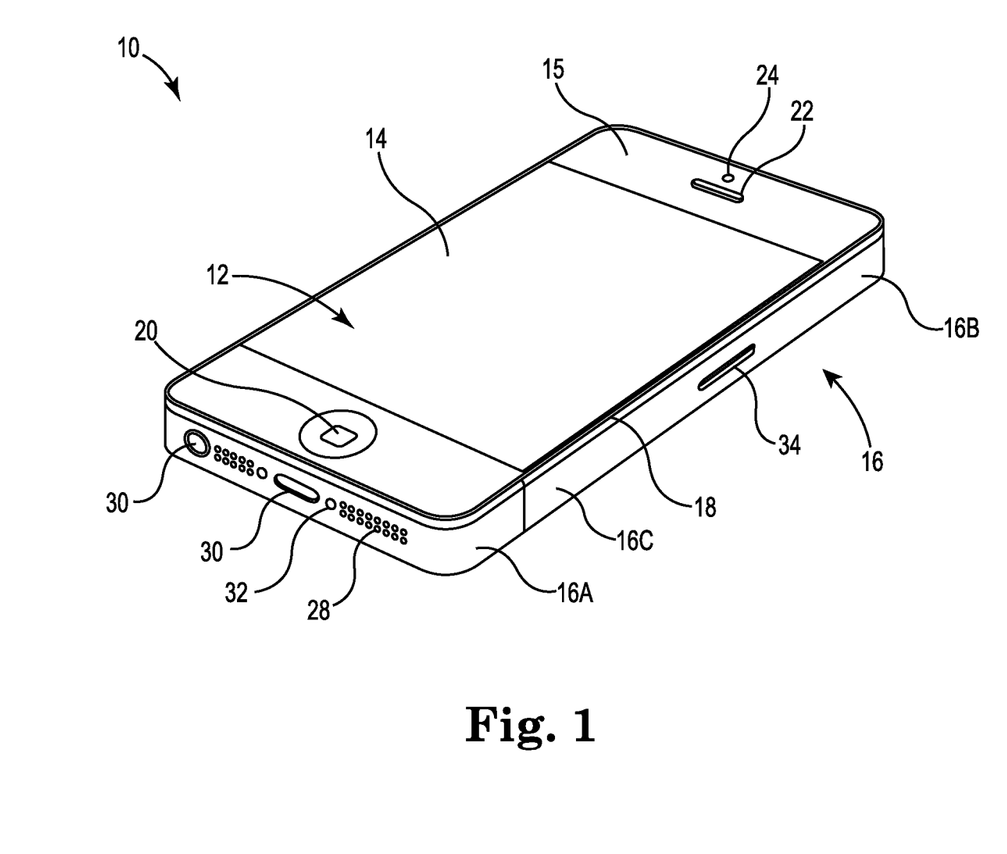
FIG. 1 is a front perspective view of a digital electronic device with an insert molded ceramic control mechanism.
Figure 2:
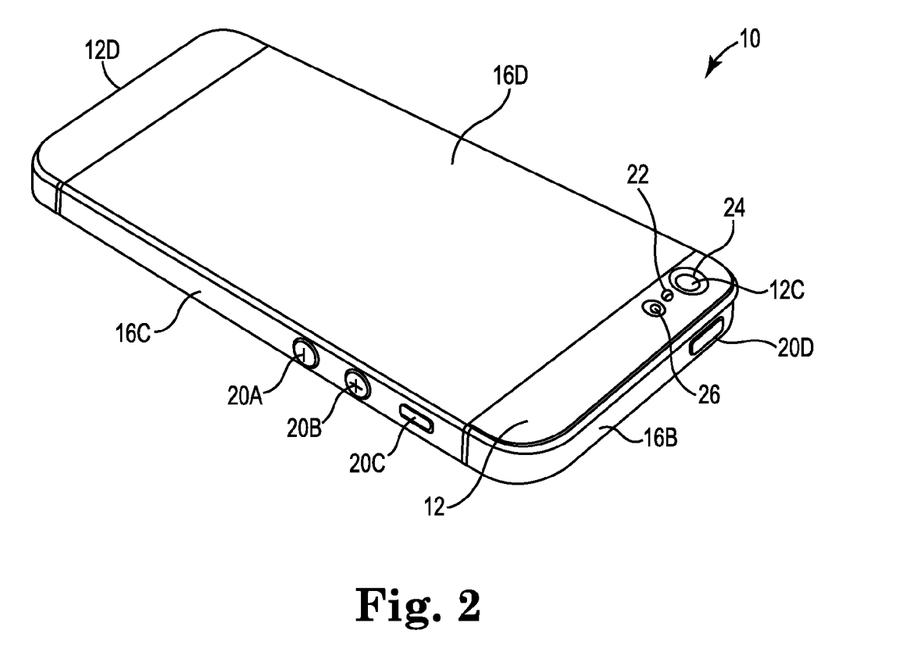
FIG. 2 is a rear perspective view of the device.

FIG. 1 is a perspective view of digital electronic device 10, in a communications embodiment. As shown in FIG. 1, device 10 includes cover glass 12 with display window 14 and housing assembly 16, as configured, for example, in a mobile phone or smartphone application. Alternatively, device 10 may be configured as a media player, digital assistant, tablet computer, personal computer, computer display, or other electronic device, in either portable or stationary form. FIG. 2 is a rear perspective view of device 10, showing the back cover glass and housing configuration.

In the particular example of FIGS. 1 and 2, front and read cover glasses 12 are coupled to top and bottom housing components 16A and 16B of housing assembly 16 via a bezel or frame assembly 18. Cover glass components 12 may incorporate an aluminum oxide ceramic or sapphire material, selected to provide impact resistance, durability, and improved stress and strain performance. Control mechanism 20 utilizes an insert molded ceramic control mechanism to provide matching performance, in combination with improved optical features, as described below.

Display window 14 is typically configured for viewing a touch screen or other display component through cover glass 12, as defined between border regions 15. Depending on configuration, display window 14 may also accommodate interactive control features and touch-sensitive display components, with capacitive or resistive coupling across the front surface of cover glass 12.

Front and rear cover glasses 12 may also include apertures to accommodate additional control and accessory features, including, but not limited to, a home button, menu button, or other control device 20, and one or more audio (e.g., speaker or microphone) features 22, sensors or cameras 24, and lighting or indicator features 26 (e.g., a flash unit or light emitting diode).

Housing 16 and frame 18 are typically formed of metal, composites, and/or durable polymer materials, including metals and metal alloys such as aluminum and stainless steel, durable plastics, and carbon-based or fiber/matrix composites. Housing 16 and frame 18 may either be provided in substantially unitary form, or as discrete components, for example with bottom housing 16A, top housing 16B, and side housing sections 16C coupled across middle plate 16D to form the back surface of device 10, between separate back glass components (or insets) 12, as shown in FIG. 2.

Cover glasses 12 and housing can also be configured to accommodate additional accessory features, including, but not limited to, speaker or microphone apertures 28, connector apertures 30 for power, audio, and data communications, mechanical fasteners 32, and access ports 34, e.g., for a subscriber identity module or SIM card, a flash memory device, or other internal component of electronic device 10. Device 10 may also accommodate additional control features, for example volume buttons 20A and 20B, ringer/mute switch 20C, and hold button 20D, as provided in any combination of cover glass components 12 and housing assembly 16.

Figure 3A:
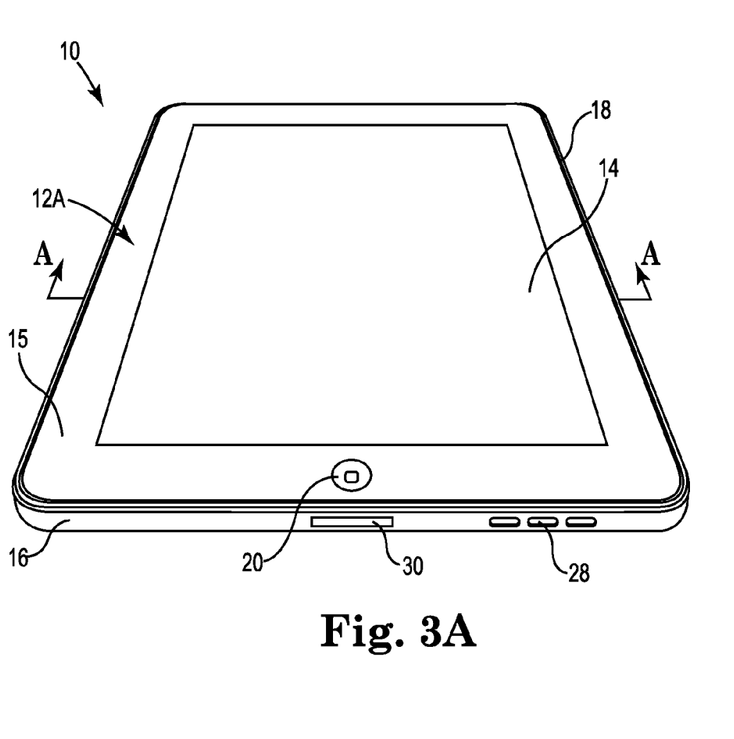
FIG. 3A is a front perspective view of the device, in a tablet configuration.

FIG. 3A is a front perspective view of electronic device 10 in an alternate embodiment, for example a media player, tablet computer, pad computer, or other computing device, or a computer monitor or display. As shown in FIG. 3A, front glass 12 is configured to accommodate display window 14 and accessory features including a ceramic inset molded home button or other control device 20. The various horizontal and vertical orientations of device 10 are arbitrary, and designations of the front, back, top, bottom, and side components may be interchanged without loss of generality.

Housing assembly 16 may have a substantially unitary configuration, for example with a unitary housing 16 formed together with the back cover of device 10. Housing 16 can also be coupled to front glass 12 with a substantially internal frame or bezel member 18, or via in internal groove in housing 16, with adhesive or mechanical coupling to front glass 12. One or both of housing 16 and frame 18 may also be formed of a plastic or other durable polymer material, rather than metal, or using a combination of metal, plastic polymer, and composite materials.

Figure 3B:
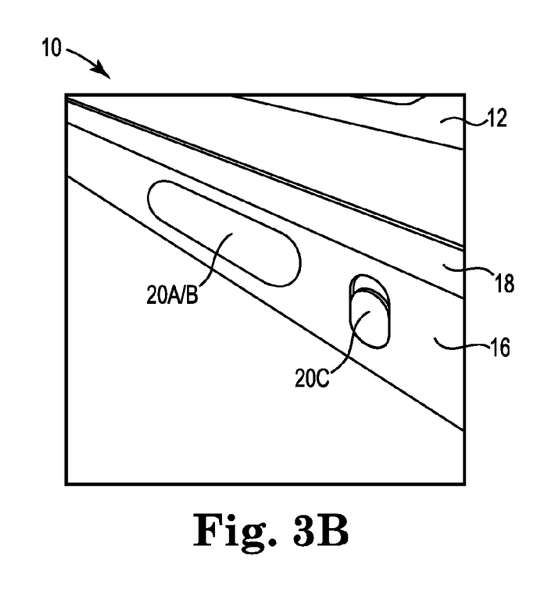
FIG. 3B is side view of the device, with an alternate control mechanism configuration.

FIG. 3B is a side view of electronic device 10, for example a media player or tablet computer, as shown in FIG. 3A. One or more control features such as a combined rocker-type volume switch 20A/B and sliding mute switch 20C are provided in housing 16, or, alternatively, in cover glass 12.

Figure 4:
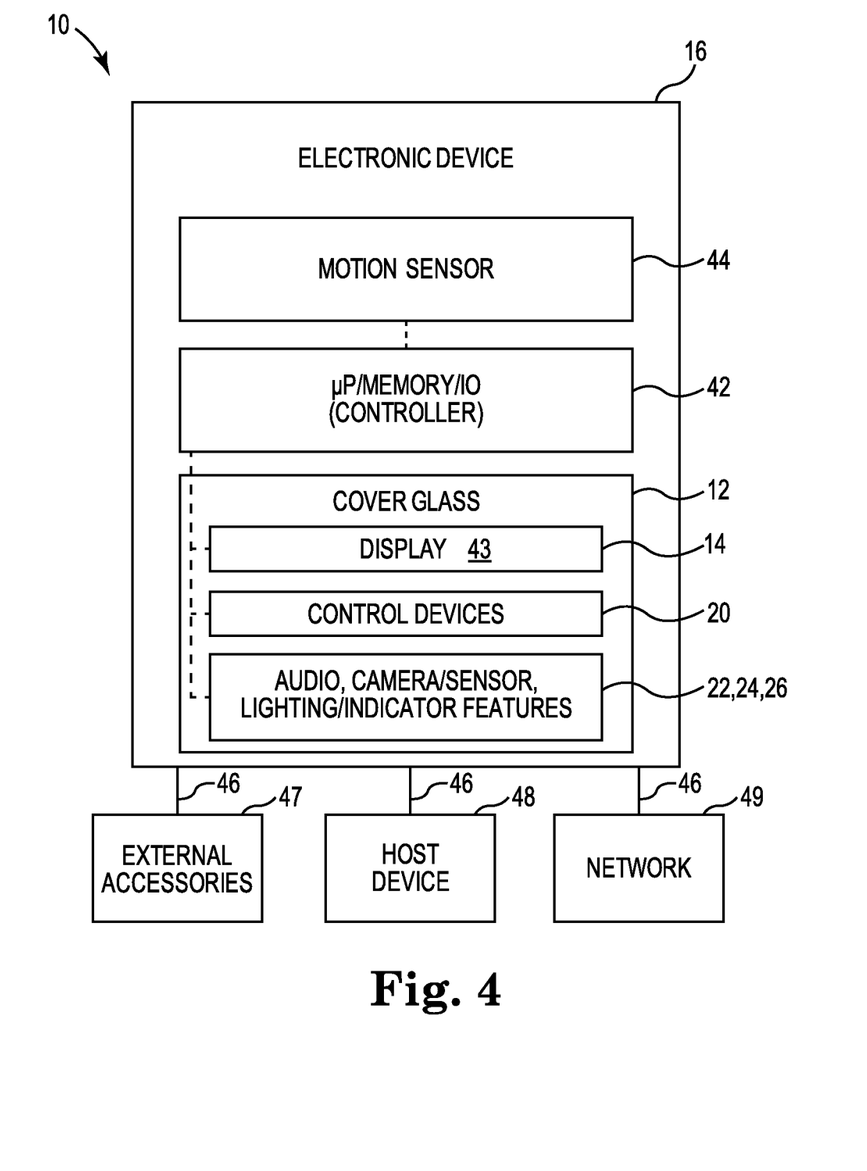
FIG. 4 is a block diagram illustrating internal and external components of the device.

FIG. 4 is a block diagram illustrating various internal and external components of electronic device 10, including microprocessor/controller 42, display 43, an accelerometer or other motion sensor 44, and additional accessories and control features 20, 22, 24, and 26. Device 10 encompasses a range of different portable and stationary electronic applications, as described in FIGS. 1, 2, 3A, and 3B, above, as well as hybrid devices including smartphones with media player capabilities, game players, remote global positioning and telecommunications devices, and laptop, desktop, notebook, handheld and ultraportable computer devices and displays.

As shown in FIG. 4, controller 42 is electronically coupled to display 43, an accelerometer or other motion sensor 44, control devices 20, and accessory features 22, 24, and 26. Various hard-wired and wireless communication connections 46 may be provided to support one or more external accessories 47, host devices 48, and/or networks 49.

Controller 42 includes microprocessor (µp) and memory components configured to execute a combination of operating system and application firmware and software, in order to control device 10 and provide various functionality including, but not limited to, voice communications, voice control, media playback and development, internet browsing, email, messaging, gaming, security, transactions, navigation, and personal assistant functions. Controller 42 may also include a communications interface or other input-output (IO) device configured to support connections 46 to one or more external accessories 47, host devices 48, and network systems 49, including hard-wired, wireless, audio, visual, infrared (IR), and radio frequency (RF) communications.

Cover glass 12 is formed of an aluminum oxide ceramic or sapphire material to improve strength, durability, stress and strain performance, and resistance to abrasion and scratching. Control devices 20 are formed as insert molded ceramic components, disposed within cover glass 12, and may include any combination of one or more individual control devices 20A-20D, as described above, or other insert molded ceramic control components. The materials and structures of inert molded control devices are selected to match the performance features of cover glass 12, and to provide improved optical performance, as described in more detail below.

As used herein, the terms "glass" and "cover glass" are not limited to amorphous forms such as silica glass, but also encompass sapphire, sapphire glass, and other aluminum oxide ceramics, in either substantially single-crystal or polycrystalline form. The terms "sapphire" and "sapphire glass" encompass $\alpha$-$Al_2O_3$ and other aluminum oxide materials with varying degrees of trace elements and impurities, including sapphire, corundum, ruby, and ion impregnated or doped aluminum oxide ceramics and sapphire materials.

These definitions reflect usage in the art, in which cover glasses, front glasses, back glasses, glass inlays, glass insets, glass inserts, and other "glass" components may be provided in the form of silica glass, lead crystal, quartz, and other amorphous or polycrystalline forms. The definitions also reflect usage in this disclosure, where cover glasses and other "glass" components may be formed of aluminum oxide ceramics and sapphire materials, in either substantially single-crystal or polycrystalline (e.g., fused polycrystalline) form.

The term "substantially single crystal" encompasses both identically single-crystal and substantially single-crystal forms of sapphire material, as distinguished from amorphous and polycrystalline forms. The term "substantially single crystal" does not does not necessarily imply a fault-free construction, and may include some degree of inclusions and lamellar twinning, including crystal plane orientations in which such localized faults, inclusions, and lamellar twinning are present, but in which the same or substantially similar crystal plane orientation is expressed or extant across the structure the component, for example as defined between (e.g., interior and exterior) major surfaces of the component.

Figure 5A:
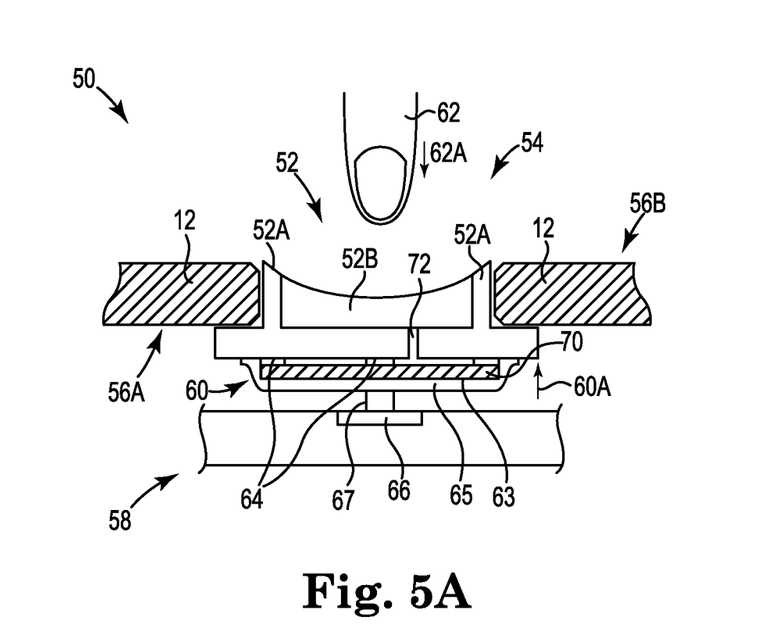
FIG. 5A is a cross-sectional view of a control mechanism for the device, with an insert molded ceramic actuator member.

FIG. 5A is a cross-sectional view of control mechanism 50 for electronic device 10. Control mechanism 50 includes a insert molded ceramic control button or switch member 52, disposed within control aperture 54, as defined within cover glass 12. Control aperture 54 extends through cover glass component 12, from first (e.g., interior) major surface 56A to second (e.g., exterior) major surface 56B. Control actuator 58 is provided on the interior of the device, proximate control aperture 54 at interior surface 56A or cover glass 12.

Cover glass 12 may comprise a front or back glass, or an inset, insert, or other cover glass component, as described above with respect to digital electronic device 10. Control mechanism 50 and insert molded ceramic control member 52 may be configured as a pushbutton, rocker, or slide switch control mechanism 20 or 20A-20D, as shown in any of FIGS. 1, 2, 3A and 3B, or as a similar control mechanism configured for operation of control actuator 58.

Insert molded ceramic control member 52 is formed by molding a sleeve or bearing member 52A about ceramic insert 52B. Bearing member 52A may be formed of a metal or metal alloy, or a durable polymer such as a plastic, and ceramic insert 52B may be formed of a ceramic material, for example a transparent ceramic such as sapphire, ruby or corundum. Control member 52 is operable to actuate control actuator 58 on the contact surface of ceramic insert 52B, exterior to cover glass or housing 12.

A spring, inverted dome, or other resilient bias element 60 may be provided to bias control member 52 in an upward or outward direction (arrow 60A), against or interior surface(s) 56B of cover glass (or housing) 12. Bearing member 52 is molded about ceramic insert 52A, and has a hardness substantially less than that of ceramic insert 52A and cover glass 12, in order to prevent binding and reduce friction during operation of control mechanism 50.

In operation, an external (e.g., inward or downward) force or pressure is applied to control member 52, for example by finger 62, or a stylus, pen, pencil or other device. Bias element 60 retains control member 52 within aperture 54, with ceramic insert 52B separated from the inner sides or edges of cover glass 12 by sleeve or bearing member 52A. Cover glass 12 may also be beveled at aperture 54, as shown in FIG. 5A, in order to further reduce friction and improve performance.

When the external force on ceramic insert 52B overcomes the outward bias from resilient spring or inverted dome element 60 (arrow 60A), control member 52 moves in an inward direction (arrow 62A), causing actuator 58 to complete an electrical contact, for example via one or more conducting base members 63 and inner and outer conducting pads 64. Thus, control member 52 is positionable within aperture 54 to operate actuator 58, and to toggle control mechanism 50 between different states, for example ON and OFF.

Alternatively, control member 52 operates actuator 58 to select a particular digital or logical state for control mechanism 50 (e.g., 0 or 1), or to scale control mechanism 50 across a digital or analog range. Additional insulator, shim, and contact structures 65, 66, and 67 may also be provided, depending on the coupling configuration and operational arrangement of control member 52 and actuator 58.

In some designs, control mechanism 50 may include an LED or other light source 70 positioned proximate aperture 54, in order to illuminate control member 52, including one or both of bearing member 52A and ceramic insert 52B. Ceramic insert 52B, for example, may have an index of refraction substantially matching that of the cover glass, in order to present substantially the same or similar optical appearance and performance. Bearing member 52A may also have a matching index of refraction, and bearing member 52A and ceramic insert 52B may be co-machined to present a substantially optically matching contact surface for actuation of control mechanism 50.

Alternatively, one or both of bearing member 52A and ceramic insert 52B may have a non-matching index of refraction, or one or both members may be opaque. In some of these designs, light channel 72 may be provided to transmit light from light source 70 through (e.g. opaque) bearing member 52A to (e.g., transparent) ceramic insert 52B.

Figure 5B:
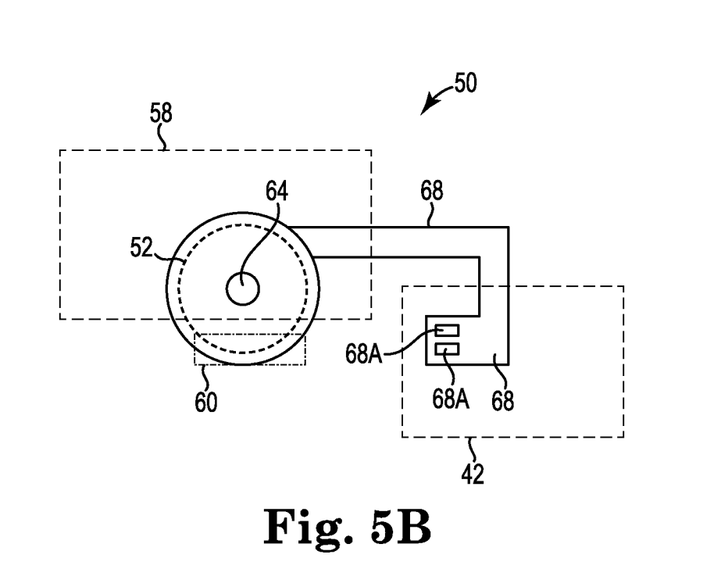
FIG. 5B is a schematic view illustrating internal elements of the control mechanism.

FIG. 5B is a schematic diagram illustrating the internal elements of control mechanism 50, including ceramic insert control member 52 and actuator 58, as shown in FIG. 5A. In general, actuator 58 may be coupled to a controller or other circuit element 42 utilizing a flex circuit (or other connector) 68, with terminals 68A.

When control member 52 is depressed against bias element 60, one or more pads or other contact elements 64 are positioned in electrical contact, generating a control signal through connector 68. Controller 42 determines the control state of mechanism 50 by sensing the signal across terminals 68A, in order to set or control various operational features such as menu control, or volume, mute, power and other functions.

As shown in FIGS. 5A and 5B, cover glass 12 may be made from a ceramic material such as sapphire, suitable for use with a mobile product or other electronic device 10. For example, sapphire is a transparent ceramic material with an index of refraction of about 1.77, while typical alumina silicate glass has an index of refraction of about 1.5. From a user perspective, ceramic cover glass may thus appear lighter in color, depending upon lighting conditions and environments.

In mobile phone, smartphone, tablet computer, and other mobile device applications, users may interact with both cover glass 12 and a menu button or other control mechanism 50, as provided within the cover glass assembly. For a ceramic cover glass 12 and control member 52 to match in appearance, insert 52B may also be formed of ceramic, as described above. In addition, an optically matching protection sleeve or bearing member 52A is also provided between the ceramic insert 52B and ceramic cover glass 12.

This distinguishes from plastic materials with an index of refraction of 1.5, which are designed to match silica glass. Bearing member or sleeve 52A also prevents or substantially reduces contact between ceramic insert 52B and cover glass 12, reducing the risk that either component will chip or fracture at any point of contact To prevent such potential damage, this disclosure incorporates an insert molded design for control member 52, in which a (e.g., plastic) bearing member or sleeve 52A encapsulates ceramic insert or cap 52B, forming a menu button or other control device 50 within aperture 54 in cover glass 12.

Ceramic insert 52B can be configured to sit centered on the external surface of control device 50, where the user would make contact to operate actuator 58.

Bearing member 52A provides support for ceramic cap or insert 52B, and also acts as a sleeve or barrier between the menu button or other insert 52B and cover glass 12. The plastic material of bearing member 52A may be optically opaque, transparent, or optically clear, or provided in one or more colors. Various different polymers, plastics and resins may be suitable for bearing member 52A, without limitation except as determined by the desired optical and mechanical properties.

In particular applications, for example, a ceramic cover glass 12 and ceramic menu button or other insert 52B may be separated by an optically clear plastic sleeve or bearing member 52A, which would act as a sliding surface between the two parts, during actuation of control mechanism 50. The clear plastic or other material of sleeve 52B may be insert molded about insert or cap 52B, and designed to blend with its optical properties.

Co-machining and co-polishing of sleeve 52A and insert cap 52B may be utilized to provide a menu button or other control member 52 with a substantially single optical surface, as described above. Where the indexes of refraction or other optical properties are matched, moreover, it would be difficult for a user to distinguish between ceramic insert 52B and the (e.g., plastic) material of bearing member or sleeve 52A.

In addition, plastic portions of control member 52 (including, e.g., sleeve 52A) may be back painted with colors, or example black, white, or other colors, in order to match any corresponding color features of cover glass 12 and the menu button or other insert 52B. Color can be also added to the back surface of ceramic cap 52A, and the (e.g., plastic resin) material of sleeve 52A can be color matched to cover glass 12.

In applications where the material of bearing member 52A is color matched, optically clear adhesive may also be used to bond an (e.g., clear) ceramic cap or insert 52B to the (e.g., plastic colored resin) material of bearing/support or sleeve member 52A. Overall, this disclosure thus incorporates plastic resins and other materials to act as a mechanical barrier between ceramic cover glass components 12 and ceramic menu buttons and other ceramic inserts 52B. A multitude of other colors and/or resins can also be incorporated into the insert molded (e.g., plastic resin shot) material, in order to achieve the desired mechanical and optical properties for menu buttons and other control member/actuator assemblies 50 and 52, suitable for use on a wide range of electronic devices 10, as described above.

Figure 6:
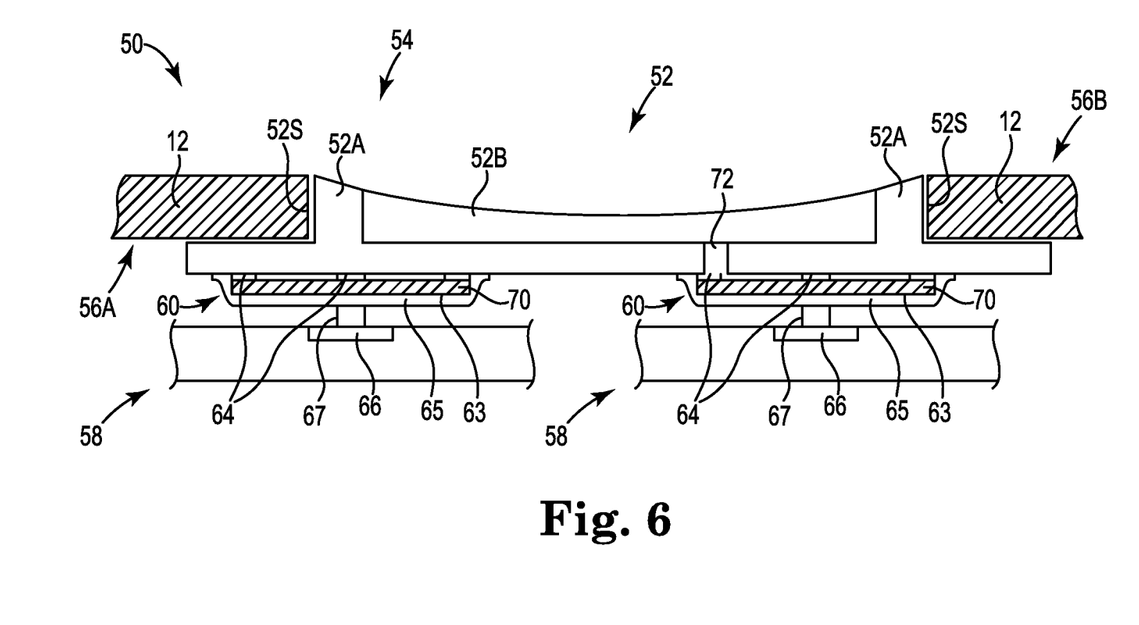
FIG. 6 is a cross-sectional view of the control mechanism, in a dual actuator or rocker switch configuration.

FIG. 6 is a cross-sectional view of control mechanism 50, with insert molded ceramic control member 52 provided in a dual actuator or rocker switch configuration. In this particular example, control member 52 has a substantially elongated geometry, extending across two separate, independently operable actuator mechanisms 58. Pressure or force may be applied to control member 52 in two separate locations along ceramic cap or insert 52B, in order to operate one or both of actuator mechanisms 56.

FIG. 6 also illustrates that while cover glass 12 may either be beveled or unbeveled along inner sides 56S, at aperture 54. Inner sides 56S form the contact surface with control member 52, along the corresponding outer surfaces of sleeve/support or bearing member 52A, in which ceramic insert or cap 52B is embedded.

Figure 7:
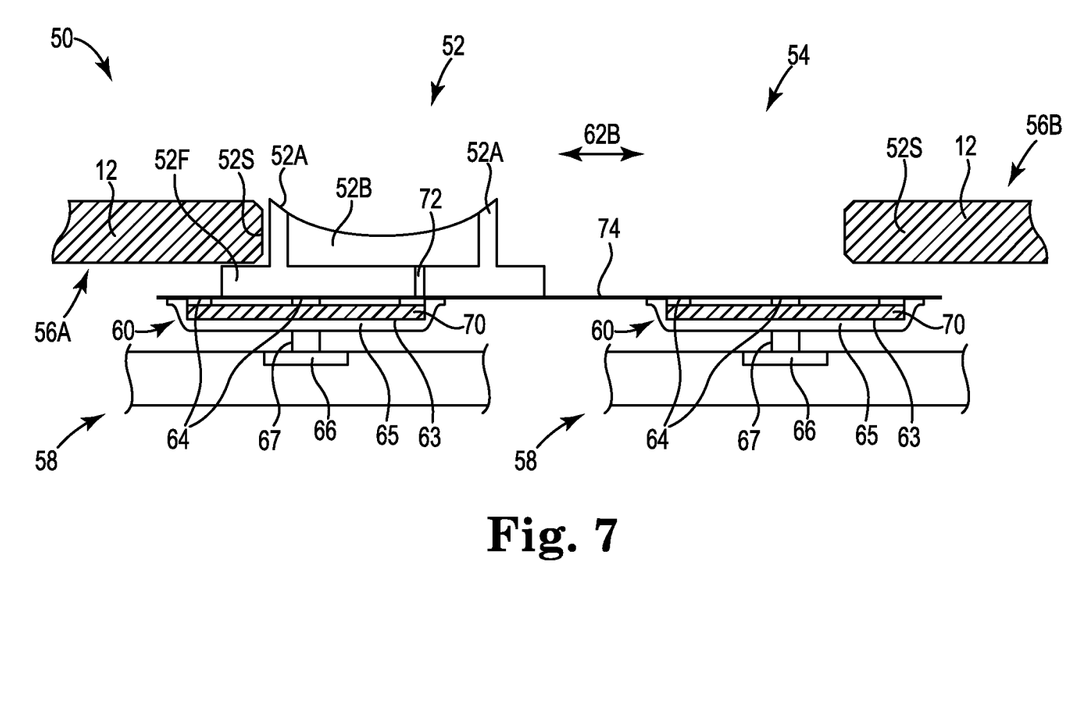
FIG. 7 is an alternate cross-sectional view of the control mechanism, in a sliding switch configuration.

FIG. 7 is an alternate cross-sectional view of control mechanism 50, with insert molded ceramic control member 52 provided in a sliding switch type configuration. In this particular example, control member 52 is configured to slide transversely within control aperture 54, from a first lateral position along sliding member or translation surface 74, in which control member 52 operates or actuates first (left-side) control actuator 58, as shown in FIG. 7, to a second lateral position along sliding member or switch translation surface 72, in which control member 52 operates or actuates second (right-side) control actuator 58.

In sliding switch configurations, the actuation direction of control member 52 is substantially lateral (arrow 62B), along the plane of cover glass 12, and within control aperture 54. Control member 52 can be retained within aperture 54 by the biasing force of one or more springs or resilient members 60, which bias flange portion 52F on the body of bearing member 52A against inner surfaces 56A of housing 56. Thus, the sliding switch actuation direction (arrow 62B) may be considered to extend in or out of the plane of FIG. 5A, with control aperture 54 extending in and out of the page, corresponding to the lateral actuation direction of arrow 62B, as shown in FIG. 7.

While this invention has been described with reference to exemplary embodiments, it will be understood by those skilled in the art that various changes can be made and equivalents may be substituted for elements thereof, without departing from the spirit and scope of the invention. In addition, modifications may be made to adapt the teachings of the invention to particular situations and materials, without departing from the essential scope thereof. Thus, the invention is not limited to the particular examples that are disclosed herein, but encompasses all embodiments falling within the scope of the appended claims.

We claim:

1. An electronic device comprising:
 a cover having an aperture defined therein;
 an actuator positioned within a housing of the electronic device, proximate the aperture; and
 a control member positioned within the aperture and coupled to the actuator, the control member comprising:
  a ceramic insert having a contact surface exposed to an exterior of the cover, wherein the control member is operable to actuate the actuator in response to a force on the contact surface; and
  a bearing member molded about and at least partially encapsulating the ceramic insert, the bearing member comprising:
   a bearing portion exposed to an exterior of the electronic device and positioned within the aperture between the insert and the cover; and
   a lower portion positioned between and separating the ceramic insert and the actuator; wherein
  the bearing member is formed from a material having a hardness less than that of the ceramic insert and less than that of the cover.

2. The electronic device of claim 1, further comprising a bias member configured to retain the control member within the aperture during operation.

3. The electronic device of claim 1, wherein the ceramic insert is formed of a substantially single crystal aluminum oxide material.

4. The electronic device of claim 3, wherein the cover is formed of a transparent ceramic.

5. The electronic device of claim 4, wherein the transparent ceramic comprises sapphire.

6. The electronic device of claim 5, wherein the bearing member is formed of a plastic material.

7. The electronic device of claim 1, further comprising a light source disposed proximate the aperture, the light source configured to illuminate the ceramic insert.

8. The electronic device of claim 7, wherein the ceramic insert has an index of refraction substantially matching that of the cover.

9. The electronic device of claim 8, wherein the bearing member has an index of refraction substantially matching that of the ceramic insert and that of the cover.

10. The electronic device of claim 9, wherein the ceramic insert and bearing member are configured to present a substantially optically matching contact surface for actuation of the control member.

11. An apparatus comprising:
- a ceramic cover having an aperture extending from an interior to an exterior of an electronic device;
- an actuator positioned within a housing of the electronic device, proximate the aperture; and
- a control member positioned within the aperture and coupled to the actuator, the control member comprising:
  - a substantially single crystal ceramic insert exposed to an exterior of the housing, wherein the control member is operable to actuate the actuator; and
  - a bearing member disposed about and at least partially encapsulating the ceramic insert, the bearing member comprising:
    - a bearing portion positioned within the aperture between the insert and the cover; and
    - a lower portion formed integral with the bearing portion and positioned between and separating the insert and the actuator; wherein
  - the bearing member is formed from a material having a hardness substantially less than that of the insert and substantially less than that of the cover.

12. The apparatus of claim 11, wherein the ceramic cover comprises a substantially single crystal sapphire material.

13. The apparatus of claim 12, wherein the ceramic insert is formed of a substantially single crystal aluminum oxide material.

14. The apparatus of claim 13, wherein the substantially single crystal aluminum oxide material of the ceramic insert comprises sapphire.

15. The apparatus of claim 11, wherein the bearing member is formed of a plastic material insert molded about the ceramic insert.

16. The apparatus of claim 11, wherein the bearing member is formed of a metal.

17. The apparatus of claim 11, wherein the control member is configured as one of a rocker type switch or a sliding switch operable for actuating the actuator in response to a force on the ceramic insert.

18. A digital electronic device comprising the apparatus of claim 11 in combination with a display, wherein the control member is configured as a pushbutton provided in the ceramic cover.

19. The digital electronic device of claim 18, wherein the ceramic insert has an index of refraction substantially matching that of the cover.

20. The digital electronic device of claim 19, wherein the bearing member has an index of refraction substantially matching that of the cover and ceramic insert.

* * * * *